(12) United States Patent
Vaufrey et al.

(10) Patent No.: US 12,453,216 B2
(45) Date of Patent: Oct. 21, 2025

(54) DIODE COMPRISING AT LEAST TWO PASSIVATION LAYERS, IN PARTICULAR FORMED OF DIELECTRICS, WHICH ARE LOCALLY STACKED TO OPTIMISE PASSIVATION

(71) Applicant: COMMISSARIAT A L'ENERGIE ATOMIQUE ET AUX ENERGIES ALTERNATIVES, Paris (FR)

(72) Inventors: David Vaufrey, Grenoble (FR); Corentin Le Maoult, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 590 days.

(21) Appl. No.: 17/788,430

(22) PCT Filed: Dec. 24, 2020

(86) PCT No.: PCT/EP2020/087872
§ 371 (c)(1),
(2) Date: Jun. 23, 2022

(87) PCT Pub. No.: WO2021/130368
PCT Pub. Date: Jul. 1, 2021

(65) Prior Publication Data
US 2023/0030098 A1    Feb. 2, 2023

(30) Foreign Application Priority Data
Dec. 26, 2019    (FR) ...................................... 1915641

(51) Int. Cl.
*H10H 20/84*    (2025.01)
*H10D 8/00*    (2025.01)
(Continued)

(52) U.S. Cl.
CPC .............. *H10H 20/84* (2025.01); *H10D 8/00* (2025.01); *H10D 8/043* (2025.01); *H10D 8/411* (2025.01);
(Continued)

(58) Field of Classification Search
CPC . H01L 33/44; H01L 29/66128; H01L 29/861; H01L 29/8611; H01L 33/0095; H01L 31/101; H01L 2933/0025
See application file for complete search history.

(56) References Cited

U.S. PATENT DOCUMENTS 11,538,963 B1 * 12/2022 Yadavalli ................ H01L 33/32
11,949,054 B2 * 4/2024 Schmid ................... H01L 33/22
(Continued)

OTHER PUBLICATIONS

Lu, Q.-H., & Zheng, F. (2018). Polyimides for electronic applications. Advanced Polyimide Materials, 199-200. DOI 10.1016/B978-0-12-812640-0.00005-6 (Year: 2018).*
(Continued)

*Primary Examiner* — Michelle Mandala
(74) *Attorney, Agent, or Firm* — Oblon, McClelland, Maier &Neustadt, L.L.P.

(57) ABSTRACT

A diode includes a stack of semiconductor layers and an active area arranged within the stack. The stack includes a lateral surface. The diode includes a first passivation layer and a second passivation layer, the first passivation layer being in contact with the lateral surface, and the second passivation layer being in contact with the lateral surface. The second passivation layer is formed partially on the first passivation layer.

16 Claims, 6 Drawing Sheets

(51) Int. Cl.
    *H10D 8/01*           (2025.01)
    *H10H 20/01*         (2025.01)
    *H10F 30/21*         (2025.01)

(52) U.S. Cl.
    CPC ............ *H10H 20/01* (2025.01); *H10F 30/21* (2025.01); *H10H 20/034* (2025.01)

(56) References Cited

U.S. PATENT DOCUMENTS

| | | |
|---|---|---|
| 2011/0275173 A1 | 11/2011 | Khaja et al. |
| 2011/0316110 A1* | 12/2011 | Hoenk .............. H01L 31/02161 |
| | | 257/E31.093 |
| 2012/0001222 A1 | 1/2012 | Moon et al. |
| 2012/0033409 A1 | 2/2012 | Jeong et al. |
| 2016/0093769 A1 | 3/2016 | Vom Dorp et al. |
| 2021/0043796 A1* | 2/2021 | Hartmann ............ H01L 33/0093 |
| 2021/0066563 A1* | 3/2021 | Lee .......................... G09G 3/32 |
| 2022/0320371 A1* | 10/2022 | Park ......................... H01L 33/24 |
| 2023/0014515 A1* | 1/2023 | Kim ......................... H01L 33/38 |

OTHER PUBLICATIONS

Lu, Q.-H., & Zheng, F. (2018). Polyimides for electronic applications. Advanced Polyimide Materials, 199-200. DOI 10.1016/B978-0-12-812640-0.00005-6 (Year: 2018) (Year: 2018).*
International Search Report issued Apr. 9, 2021 in PCT/EP2020/087872, filed on Dec. 24, 2020, 2 pages.

* cited by examiner

DIODE COMPRISING AT LEAST TWO PASSIVATION LAYERS, IN PARTICULAR FORMED OF DIELECTRICS, WHICH ARE LOCALLY STACKED TO OPTIMISE PASSIVATION

TECHNICAL FIELD OF THE INVENTION

The technical field of the invention relates to diodes, preferably light-emitting diodes, and more particularly inorganic semiconductor-based light-emitting diodes. More particularly, the invention relates to a diode comprising a stack of semiconductor layers, the stack comprising a lateral surface and the diode comprising an active area arranged within the stack.

PRIOR ART

In the prior art it is known how to manufacture a light-emitting diode comprising a stack of semiconductor layers. The light-emitting diode comprises an active area located in the stack, in which area the charge carriers recombine with each other during the operation of the light-emitting diode. The stack of semiconductor layers is usually passivated on its lateral sides by means of a passivation layer. These lateral sides may be formed by faces that are parallel or substantially parallel to the direction of flow of the current in the stack. Such a passivation layer has the advantage of limiting parasitic electrical, optical or optoelectronic effects at the edge of the light-emitting diode. These limitations are advantageous because they enable the performance of the light-emitting diode to be improved.

Existing passivation methods for light-emitting diodes do not enable the efficiency of these light-emitting diodes to be optimized. This is because it has been found that the efficiency of light-emitting diodes depends on their dimensions; that is to say, the efficiency of a light-emitting diode decreases monotonically with its dimensions.

OBJECT OF THE INVENTION

The object of the invention is to improve the passivation of a diode in order to improve its performance.

For this purpose, the invention relates to a diode comprising:
  a stack of semiconductor layers, the stack comprising a lateral surface, and
  an active area arranged within the stack,
this diode comprising a first passivation layer and a second passivation layer, the first passivation layer being in contact with the lateral surface, the second passivation layer being in contact with the lateral surface. The second passivation layer 108 is formed partially on the first passivation layer 107.

This makes it possible to tackle a problem of improving the passivation of the diode. As a result, this also makes it possible to tend toward an efficiency of the diode, if it is light-emitting, that is independent of its dimensions, by passivating parts of the light-emitting diode more specifically. For a current diode, the improvement of its passivation makes it possible to limit the presence of currents caused by recombination on the sides of the diode.

The diode may also have one or more of the following characteristics:
  the stack comprises a layer of first-type doped semiconductor material and a layer of second-type doped semiconductor material, and the diode is such that: the first passivation layer is in contact, at the lateral surface, with the layer of first-type doped semiconductor material; the second passivation layer is in contact, at the lateral surface, with the active area; and the active area is arranged between the layer of first-type doped semiconductor material and the layer of second-type doped semiconductor material, or the active area is arranged at a junction between the layer of first-type doped semiconductor material and the layer of second-type doped semiconductor material;
  the diode comprises a third passivation layer, the third passivation layer being in contact, at the lateral surface, with the layer of second-type doped semiconductor material;
  the first passivation layer is formed from a first dielectric material and the second passivation layer is formed from a second dielectric material;
  the third passivation layer is formed from a third dielectric material;
  the diode is such that the first dielectric material has an electrical conductivity at least three orders of magnitude lower than the electrical conductivity of the first-type doped semiconductor material, and that the second dielectric material has an electrical conductivity at least three orders of magnitude lower than the electrical conductivity of the semiconductor material forming the active area;
  the diode is such that the active area comprises an intrinsic semiconductor material and that the band offset between the valence band of the intrinsic semiconductor material and the valence band of the second dielectric material is strictly greater than 3 kT/q, and that the band offset between the conduction band of the intrinsic semiconductor material and the conduction band of the second dielectric material is strictly greater than 3 kT/q, where k is the Boltzmann constant, T is the ambient temperature in kelvin, and q is a constant corresponding to the elementary charge in coulombs;
  the third dielectric material has an electrical conductivity at least three orders of magnitude lower than the electrical conductivity of the second-type doped semiconductor material;
  the diode is such that, the first type being n-type, the band offset between the conduction band of the first dielectric material and the conduction band of the first-type doped semiconductor material is strictly greater than 3 kT/q, and that, the second type being p-type, the band offset between the valence band of the third dielectric material and the valence band of the second-type doped semiconductor material is strictly greater than 3 kT/q, where k is the Boltzmann constant, T is the ambient temperature in kelvin, and q is a constant corresponding to the elementary charge in coulombs;
  the diode is such that, the second type being n-type, the band offset between the conduction band of the third dielectric material and the conduction band of the second-type doped semiconductor material is strictly greater than 3 kT/q, and that, the first type being p-type, the band offset between the valence band of the first dielectric material and the valence band of the first-type doped semiconductor material is strictly greater than 3 kT/q, where k is the Boltzmann constant, T is the ambient temperature in kelvin, and q is a constant corresponding to the elementary charge in coulombs.

The invention also relates to a method of manufacturing a diode such as that described, the manufacturing method comprising:
- a step of forming a stack of semiconductor layers, part of said stack being intended to form an active area of the diode,
- a step of forming and passivating a lateral surface of the stack of semiconductor layers, said step of forming and passivating the lateral surface comprising forming a first passivation layer and forming a second passivation layer, the first and second passivation layers being in contact with the lateral surface, the second passivation layer being formed partially on the first passivation layer.

The manufacturing method may have one or more of the following characteristics:
- the step of forming and passivating the lateral surface comprises, in succession: a first etching step executing etching of the stack so as to form a first part of the lateral surface; a step of depositing a first dielectric material so as to form the first passivation layer, the first passivation layer covering the first part of the lateral surface; a second etching step executing etching of the first dielectric material deposited and of the stack so as to form a second part of the lateral surface; and a step of depositing a second dielectric material so as to form the second passivation layer, the second passivation layer covering the second part of the lateral surface and being in contact with the first passivation layer;
- the first and second parts are preferably formed by different materials;
- the manufacturing method comprises: a first step of treatment applied to the first part of the lateral surface before the execution of the step of depositing the first dielectric material, and a second step of treatment applied to the second part of the lateral surface before the execution of the step of depositing the second dielectric material;
- the first treatment step and the second treatment step being different;
- the first treatment step comprises a step of cleaning the first part and/or a step of surface etching the first part and/or a step of grafting elements onto the first part;
- the second treatment step comprises a step of cleaning the second part and/or a step of surface etching the second part and/or a step of grafting elements onto the second part;
- the step of forming and passivating the lateral surface comprises: a third etching step executing etching of the second dielectric material deposited and of the stack so that a third part of the lateral surface is formed; a step of depositing a third dielectric material so as to form a third passivation layer, the third passivation layer covering the third part of the lateral surface and being in contact with the second passivation layer;
- the third part is preferably formed by a different material from the material forming the second part;
- the manufacturing method comprises a third step of treatment applied to the third part of the lateral surface before the execution of the step of depositing the third dielectric material;
- the third treatment step comprises a step of cleaning the third part and/or a step of surface etching the third part and/or a step of grafting elements onto the third part;
- the manufacturing method is such that the step of forming the stack of semiconductor layers is such that the stack comprises a layer of first-type doped semiconductor material and a layer of second-type doped semiconductor material, the first part of the lateral surface being delimited by a portion of said layer of first-type doped semiconductor material, and the second part of the lateral surface being delimited by a portion of the active area;
- the active area is arranged between the layer of first-type doped semiconductor material and the layer of second-type doped semiconductor material, or the active area is arranged at a junction between the layer of first-type doped semiconductor material and the layer of second-type doped semiconductor material;
- the third part of the lateral surface is delimited by a portion of the layer of second-type doped semiconductor material.

Other characteristics and advantages may be more readily apparent from the following detailed description.

BRIEF DESCRIPTION OF THE DRAWINGS

The invention will be more readily understood from a perusal of the following detailed description, which is provided solely by way of non-limiting example, and which refers to the attached drawings listed below.

In these figures, the same references are used to denote the same elements.

DETAILED DESCRIPTION

"Substantially parallel" is taken to mean parallel to plus or minus 30 degrees.

"Between two values" is taken to mean that the boundaries defined by these two values are included in the range of values concerned.

"Different materials" is taken to mean materials that differ in their composition, although they may contain one or more elements in common.

"Based on", in relation to a device such as a diode based on a material, is taken to mean that this material forms the largest part of the composition of this device.

Figure 1:
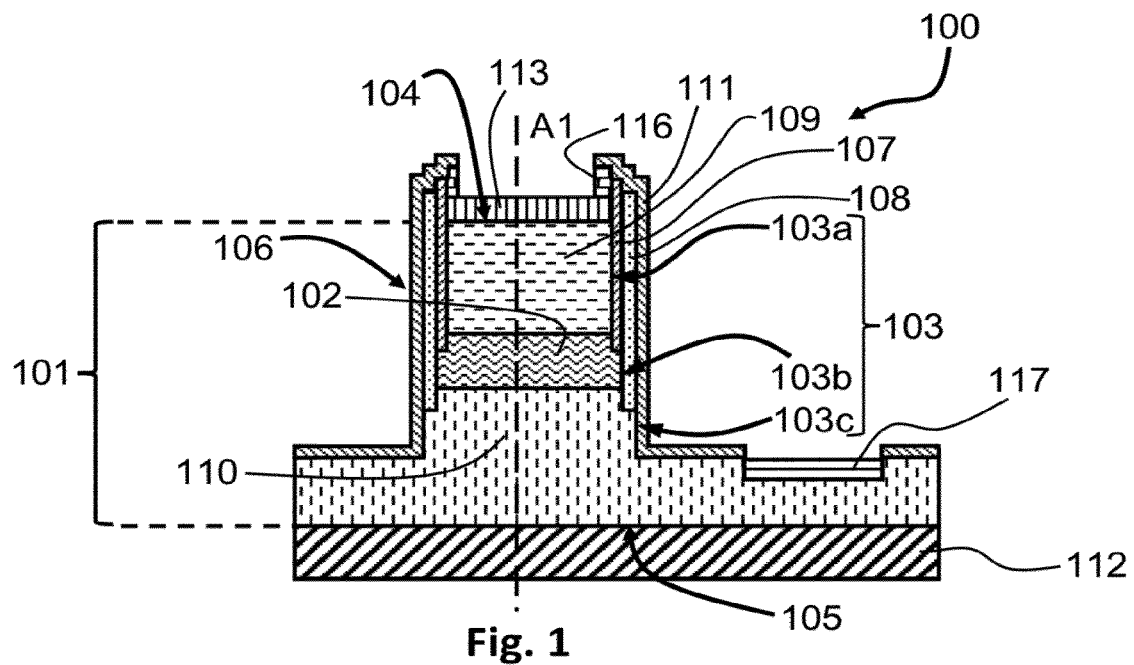
FIG. 1 shows schematically, in cross section, a diode according to a particular embodiment of the invention, for which the diode is preferably a light-emitting diode.
Figure 2:
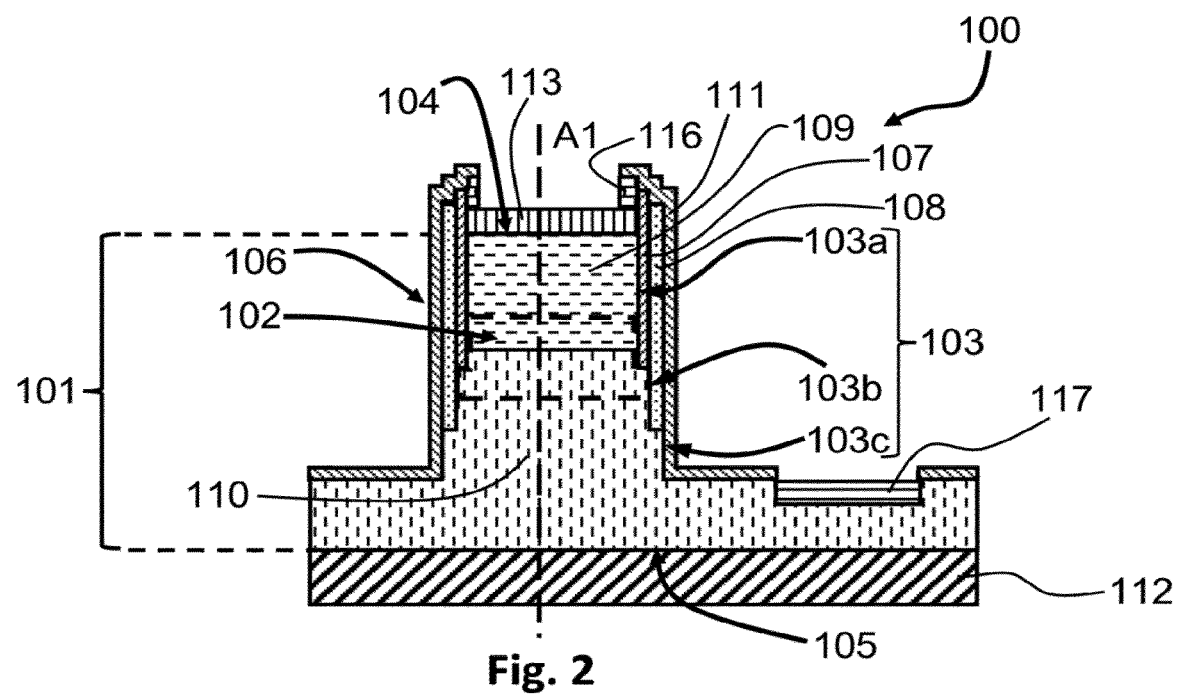
FIG. 2 shows schematically, in cross section, a variant of the diode according to a particular embodiment of the invention, for which the diode is preferably a light-emitting diode.

The invention relates to a diode 100, particular embodiments of which are shown in FIGS. 1 and 2. The diode 100 comprises a stack 101 of semiconductor layers. The diode 100 comprises an active area 102 arranged within the stack 101; that is to say, the active area 102 forms a part of the stack 101. The stack 101 of semiconductor layers comprises a lateral surface 103.

"Active area 102 arranged within the stack 101" is taken to mean that the stack 101 makes it possible to define this active area 102, an edge of which may define a corresponding part of the lateral surface 103.

The active area 102 is also referred to as the active region in the technical field of diodes. It is an area 102 which is optically active in the sense that the active area 102 may be used, for example, to absorb photons or to emit photons. The active area 102 is, in particular, formed by a corresponding semiconductor material.

Thus the active area 102 may be configured to allow the recombination of charge carriers, resulting in the emission of electromagnetic radiation, for example the emission of photons, by the diode 100.

Alternatively, the active area 102 may be configured to absorb photons, by the photovoltaic effect for example, resulting in the generation of charge carriers by the diode 100, these charge carriers being collectible subsequently. This results in the production of electricity by the diode 100.

Each charge carrier mentioned in the present description may be a first charge carrier or a second charge carrier. The first charge carriers are different from the second charge carriers. For example, the first charge carriers may be holes or electrons, and the second charge carriers may be holes or electrons.

Thus it follows from the above description that the diode 100 is an optoelectronic device. This diode 100 may be a light-emitting diode, a photodiode, a photodetector, a photovoltaic cell or a laser diode.

Although the active area 102 is represented schematically by a single block in FIG. 1, this active area 102 may be:
- formed by intrinsic semiconductor layers which then form the block denoted as the active area 102 in FIG. 1; for example, these intrinsic semiconductor layers are formed by multiple quantum wells if the diode 100 is of the multi-quantum well type, and the charge carriers in these intrinsic semiconductor layers may recombine when the diode 100 is a light-emitting diode, or photons may be absorbed to generate electrons and holes if the diode is a photodiode or a photodetector,
- formed by a space charge area, shown surrounded by broken lines in FIG. 2, in a p-n junction, if the diode 100 comprises this p-n junction formed by two layers of semiconductor material 109 and 110 of the stack 101, for example doped p-type and doped n-type layers respectively,
- formed by an intrinsic semiconductor layer, which then forms the active area 102 of FIG. 1, in a p-i-n junction, if the diode 100 comprises this p-i-n junction.

In the present description, an intrinsic semiconductor layer is a layer of intrinsic semiconductor material.

The stack 101 of semiconductor layers is preferably defined according to a stack axis A1 of the semiconductor layers of the stack 101, represented by a broken line in FIGS. 1 and 2. This axis A1 is also referred to, when oriented, as the "stacking direction". This stack axis A1 is parallel or substantially parallel to the direction of measurement of the thickness of each of the semiconductor layers of the stack 101 of semiconductor layers.

In particular, the stack 101 of semiconductor layers may comprise two faces 104, 105, opposed about the stack axis A1. The lateral surface 103 is preferably formed so as to extend between these two opposed faces 104, 105, and, for example, so as to connect these two opposed faces 104, 105. By way of example, in FIGS. 1 and 2, one of the faces 105 of the stack 101 of semiconductor layers is in contact with a substrate 112, and the other of the faces 104 of the stack 101 of semiconductor layers is in contact with an electrode, such as an anode 113, for example.

Thus the lateral surface 103 is preferably partially defined by a set of points for which the normal to this lateral face 103, at each of these points of the set of points, is orthogonal to the stack axis A1.

The lateral surface 103 may comprise a plurality of faces, each face of the plurality of faces forming a side of the stack 101 of semiconductor layers.

In general terms, the diode 100 comprises a first passivation layer 107 and a second passivation layer 108. The first passivation layer 107 is in contact with the lateral surface 103. The second passivation layer 108 is in contact with the lateral surface 103. In other words, the diode 100 comprises a passivation structure 106 comprising the first passivation layer 107 and the second passivation layer 108.

In other words, the lateral surface 103 may comprise a first part 103a and a second part 103b. The first passivation layer 107 is then in contact with the first part 103a of the lateral surface 103. The second passivation layer 108 is then in contact with the second part 103b of the lateral surface 103.

The second passivation layer 108 is formed partially on the first passivation layer 107. Therefore, another part of this second passivation layer 108 provides the contact between the second passivation layer 108 and the lateral surface 103. This makes it possible to form a local superimposition of the first passivation layer 107 and the second passivation layer 108, which advantageously allows the first and second parts 103a, 103b of the lateral surface 103, in contact with the first passivation layer 107 and the second passivation layer 108 respectively, to be present. This also enables the first and second parts 103a, 103b to have been surface treated, preferably in different ways, to provide each of these first and second parts 103a, 103b with passivation which is optimized for the corresponding said first or second part 103a, 103b.

In other words, the first passivation layer 107 is arranged between the stack 101 and the part of the second passivation layer 108 formed on the first passivation layer 107.

Preferably, the first passivation layer 107 surrounds part of the stack 101 of semiconductor layers around the stack axis A1, and the second passivation layer 108 surrounds part of the stack 101 of semiconductor layers around the stack axis A1. This has the advantage of providing passivation around the stack 101 of the diode 100.

Preferably, the first passivation layer 107 is also in contact with the active area 102, to ensure that a part of the stack 101 located in the extension of the active area 102 is adequately passivated by the passivation layer 107.

Because of the presence of this passivation structure 106 with at least two passivation layers formed by the first and second passivation layers 107, 108, it is possible to optimize the passivation of the diode 100 and therefore, if the diode 100 is a light-emitting diode, to tend toward an efficiency of the diode 100 which is independent of its dimensions, by passivating parts of this diode 100 more specifically. Additionally, and preferably, the presence of these first and second passivation layers 107, 108 may enable the diode 100 to be passivated differently by specific treatments of parts of the lateral surface 103, notably during the manufacture of the diode 100, as described in greater detail below.

Additionally, the first and second passivation layers 107, 108 may enable the lateral surface 103 of the stack 101 to be passivated differently when the materials of these first and second passivation layers 107, 108 are different, for example by using alumina (like $Al_2O_3$) and a silicon oxide (like $SiO_2$) as the different materials.

The materials of the first and second passivation layers may be the same, particularly if specific treatments of the first and second parts 103a, 103b of the lateral surface 103 are performed during the manufacture of the diode 100.

Thus, by contrast with a light-emitting diode having lateral sides passivated by a single layer of the same material, it is proposed here to use at least two passivation layers that may each be adapted to a specific part of the lateral surface 103, thus providing the advantage of allowing passivation which is adapted and custom-designed for this specific part. Consequently the use of these first and second passivation layers 107, 108 responds in an advantageous manner to a problem of improving the operation of the diode 100, for example by limiting the trapping of charge carriers at the interface between the lateral surface 103 and the first and second passivation layers 107, 108, and/or by limiting the reduction in mobility of the charge carriers at the interface between the lateral surface 103 and the first and second passivation layers 107, 108.

In the present description, passivation is taken to mean the engineering of surface defects and/or interface defects with the aim of producing surfaces and/or interfaces that are passive in relation to:
  deliberate external actions such as the doping of the amorphous silicon after passivation of the defects with hydrogen, enabling dangling bonds to be filled,
  involuntary external actions such as adsorption or oxidation.

The aim of passivation is to control the position of the Fermi level at passivated surfaces and/or passivated interfaces. More particularly, in relation to the diode 100, passivation provides partial or total suppression of the electronic surface or interface states, and thus tends to limit all the parasitic electrical, optical or optoelectronic effects at the edge of the diode 100, that is to say at the interface between the lateral surface 103 formed by semiconductor materials of the stack 101 and the external environment of the diode 100, the aim being to tend to eliminate the electrical and/or optical characteristics that limit the performance of the diode 100, these characteristics being dependent on the interface states of this diode 100. Thus, passivation in accordance with the present description is what is known as "electro-optical" passivation.

In the present description, "interface" is taken to mean a transition area between two adjacent volumes of material, forming an abrupt plane marking a discontinuity of the properties of the two adjacent materials but equivalent to a junction region having a thickness which is usually small, being equal, for example, to the thickness of an atomic layer.

At the interface of the lateral surface 103 with a passivation layer, defects, that is to say imperfections greater than dangling bonds, may be created. These imperfections may be impurities, gaps, anti-sites, a composition disorder, surface adsorption, or specific bond angles.

Thus the passivation is selected in such a way as to limit defects within the diode 100 that may interact with charge carriers by a trapping mechanism and/or a diffusion mechanism.

The trapping mechanism, also called the localization mechanism, appears when the diode 100 is out of equilibrium, that is to say, notably, when a voltage is applied to the terminals of the diode 100. The charge carriers trapped by an interface state are no longer available for the desired effect (such as the emission of a photon or the collection of these charge carriers to produce electricity), this unavailability is temporary if the charge carriers are de-trapped after a certain period, or final if the charge carriers recombine non-radiatively with charge carriers of opposite sign. The intensity of the phenomenon caused by this trapping mechanism is a function of the density of the interface states and also of the kinetics of the exchange of charge carriers with the permitted bands of the semiconductor in question where the trapping takes place (the surface recombination velocity).

The diffusion mechanism corresponds to the reduction of the mobility of the free charge carriers at the interface of the lateral surface 103 with the passivation structure 106, due to the presence of fluctuations of the surface potential and the diffusion phenomena of the charge carriers at the lateral surface 103 caused by the roughness and interface charges at this lateral surface 103.

In the context of the diode 100, the surface that is passivated by means of the passivation structure 106 is the lateral surface 103, because the charge carriers mainly travel parallel or substantially parallel to the stack axis A1 of said stack 101, preferably at least in the active area 102.

To summarize, the lateral surface 103 may be a surface on which parasitic mechanisms operate in parallel with electroluminescence if the diode 100 is a light-emitting diode.

According to a particular embodiment, the stack 101 of semiconductor layers may comprise a layer 109 of first-type doped semiconductor material and a layer 110 of second-type doped semiconductor material. The first passivation layer 107 is in contact, at the lateral surface 103, with the layer 109 of first-type doped semiconductor material. The second passivation layer 108 is in contact, at the lateral surface 103, with the active area 102. In other words, the first part 103a of the lateral surface 103 is a portion of the layer 109 of first-type doped semiconductor material, and the second part 103b of the lateral surface 103 is a portion of the active area 102. Thus the first passivation layer 107 may passivate the portion of the layer 109 of first-type doped semiconductor material, and the second passivation layer 108 may passivate the portion of the active area 102. This particular embodiment makes it possible to provide passivations adapted for the contact with the active area 102, where the aim is to limit the trapping of charge carriers, and for the contact with the layer 109 of first-type doped semiconductor material. The passivation of the active area 102 at the lateral surface 103 is therefore preferably treated as a priority, because it is the most sensitive. The passivation of the active area 102 also makes it possible to limit, if necessary, radiative recombinations that are undesirable because they have a smaller gap; these undesirable radiative recombinations are also called SRH (Shockley-Read-Hall) surface recombinations. On the other hand, this also preferably enables the first and second passivation layers 107, 108 to be deposited sequentially during the manufacturing process, thus causing the first and second parts 103a, 103b to undergo different surface treatments. Typically, after its treatment, the first part 103*a* is protected by the first passivation layer 107 during the surface treatment of the second part 103*b*.

Thus the passivation structure 106 may make it possible to passivate in different ways the material of the active area 102 on the second part 103*b*, and the material of the layer 109 of first-type doped semiconductor material on the first part 103*a*, with allowance for the specific features of each of the layer 109 of first-type doped semiconductor material and the active area 102, notably, if appropriate, a difference in composition or defects to be eliminated between the material of the layer 109 of first-type doped semiconductor material and the material of the active area 102.

The active area 102 may be arranged between the layer 109 of first-type doped semiconductor material and the layer 110 of second-type doped semiconductor material. This may be the case if the active area 102 is formed from one or more layers, notably intrinsic semiconductor layers.

Alternatively, the active area 102 is arranged at a junction between the layer 109 of first-type doped semiconductor material and the layer 110 of second-type doped semiconductor material. This may be the case if it is the junction of the layer 109 of first-type doped semiconductor material with the layer 110 of second-type doped semiconductor material that enables the active area 102 to be formed, this active area 102 corresponding to the space charge area of said junction forming, notably, a p-n junction.

The first-type doping is opposite to the second-type doping. The first-type doping may be a p-type doping (also called p-doping), in which case the second-type doping is an n-type doping (also called n-doping), or vice versa.

It is clear from the above description that the aim is to limit the trapping of charge carriers in the active area 102 and the SRH recombinations in this active area 102, in order to provide a maximum of desired recombinations of charge carriers if the diode 100 emits an electromagnetic radiation, or to maximize the collection of charge carriers generated within the active area 102 if the diode 100 produces electricity. Additionally, during the operation of the diode 100, the second charge carriers may be represented in the form of a majority with respect to the first charge carriers. Preferably, therefore, the first type is such that the layer 109 of first-type doped semiconductor material is adapted (i.e. configured) for the mobility of the first charge carriers; the second type is such that the layer 110 of second-type doped semiconductor material is adapted (i.e. configured) for the mobility of the second charge carriers; the first charge carriers are less numerous, in the active area 102, than the second charge carriers present in this active area 102 during the operation of the diode 100, particularly in the case of a GaN-based light-emitting diode. As a result, in this case, in addition to the passivation of the active area 102, the passivation of the layer 109 of first-type doped semiconductor material takes precedence over that of the layer 110 of second-type doped material, and makes it possible to limit the loss of first charge carriers available in the active area for recombination with second charge carriers if the diode emits photons. Evidently, if the numbers of first and second charge carriers are in equilibrium within the diode 100, particularly in the active area 102, the passivation of the layer 109 of first-type doped semiconductor material does not take precedence over the passivation of the layer 110 of second-type doped material.

The use of different layers for passivating the stack 101 at the layer 109 of first-type doped semiconductor material and at the active area 102 has been described above. To improve further the passivation of the stack 101, the diode 100 may comprise a third passivation layer 111, as shown for example in FIGS. 1 and 2. The third passivation layer 111 is in contact, at the lateral surface 103, with the layer 110 of second-type doped semiconductor material. In other words, the passivation structure 106 may comprise this third passivation layer 111. Thus the lateral surface 103 may comprise a third part 103*c* corresponding to a portion of the layer 110 of second-type doped semiconductor material. Thus the third passivation layer 111 may passivate the portion of the layer 110 of second-type doped semiconductor material. This enables the passivation of the stack 101 to be adapted locally to a particular material such as the second-type doped semiconductor material of the layer 110 of second-type doped semiconductor material. This adaptation of the passivation may be provided by using a particular treatment of the third part 103*c*, as described below. The second-type doped semiconductor material is, notably, different from the first-type doped semiconductor material, and may be at least partially different from the material of the active area 102.

The third passivation layer 111 is preferably formed partially on the second passivation layer 108. Therefore, another part of this third passivation layer 111 provides the contact between the third passivation layer 111 and the lateral surface 103.

Preferably, the third passivation layer 111 surrounds part of the stack 101 of semiconductor layers around the stack axis A1, so as to play a part in the passivation around the stack 101.

For example, the first to the third passivation layers 107, 108, 111 are arranged so that each is in contact with the first, second and third parts 103*a*, 103*b*, 103*c* respectively of the lateral surface 103 and is locally superimposed. For example, in FIGS. 1 and 2:
- at the level where the first passivation layer 107 is in contact with the first part 103*a* of the lateral face 103, the first to the third passivation layers 107, 108, 111 are successively superimposed,
- at the level where the second passivation layer 108 is in contact with the second part 103*b* of the lateral face 103, the second and third passivation layers 108, 111 are superimposed.

It follows from the above description that the number of passivation layers is not limited to two or three. This is because the passivation structure 106 may comprise more than three passivation layers, each in contact with a particular material to be passivated forming a corresponding part of the lateral surface 103 of the stack 101 of semiconductor layers. This makes it possible, for example, to treat more than three parts of the lateral surface of the diode 100 in different ways. In other words, each passivation layer may be intended to allow the use of a specific passivation method for a corresponding material delimiting part of the lateral surface 103 of the stack 101.

In fact, the passivation structure 106 may be adapted for limiting the trapping in all the interfaces between the layers of the stack 101 and the passivation layers, and for limiting, if necessary, radiative recombinations that are undesirable because they have a smaller gap (SRH recombination).

Preferably, each passivation layer is a layer of electrically isolating material, also called a dielectric material, which has an electrical conductivity at least three orders of magnitude lower than the electrical conductivity of the material to be passivated in the stack 101. One order of magnitude corresponds to a factor of 10. This makes it possible to prevent current leakage through this passivation layer.

Therefore, the first passivation layer 107 may be formed from a first dielectric material, the second passivation layer 108 may be formed from a second dielectric material, and, if the third passivation layer 111 is present, this third passivation layer 111 may be formed from a third dielectric material.

The first, second and third dielectric materials may be the same, particularly if specific treatments of the first, second and third parts 103a, 103b, 103c of the lateral surface 103 are carried out during the manufacture of the diode 100.

The first, second and, if necessary, third passivation layer 107, 108, 111 may each be a multilayer structure.

Additionally, in order to prevent current leakage:
the first dielectric material may have an electrical conductivity at least three orders of magnitude lower than the electrical conductivity of the first-type doped semiconductor material,
the second dielectric material may have an electrical conductivity at least three orders of magnitude lower than the electrical conductivity of the semiconductor material forming the active area 102,
if necessary, if the third passivation layer 111 is present, the third dielectric material may have an electrical conductivity at least three orders of magnitude lower than the electrical conductivity of the second-type doped semiconductor material.

Additionally, the active area 102 may comprise, or is formed by, an intrinsic semiconductor material. In this case, the band offset between the valence band of the intrinsic semiconductor material and the valence band of the second dielectric material may be strictly greater than 3 kT/q, and the band offset between the conduction band of the intrinsic semiconductor material and the conduction band of the second dielectric material may be strictly greater than 3 kT/q. This makes it possible to prevent the trapping of charge carriers in the second dielectric material and, if necessary, makes it possible to prevent the surface conduction of the second dielectric material.

If the first type is n-type, the band offset between the conduction band of the first dielectric material and the conduction band of the first-type doped semiconductor material may be strictly greater than 3 kT/q. This makes it possible to prevent electrons from being trapped in the first dielectric material and makes it possible for the surface conduction channel of the first dielectric material not to be supplied with charge carriers of the electron type.

If the second type is n-type, the band offset between the conduction band of the third dielectric material and the conduction band of the second-type doped semiconductor material may be strictly greater than 3 kT/q. This makes it possible to prevent electrons from being trapped in the third dielectric material and makes it possible for the surface conduction channel of the third dielectric material not to be supplied with charge carriers of the electron type.

If the second type is p-type, the band offset between the valence band of the third dielectric material and the valence band of the second-type doped semiconductor material may be strictly greater than 3 kT/q. This makes it possible to prevent holes from being trapped in the third dielectric material and makes it possible for the surface conduction channel of the third dielectric material not to be supplied with charge carriers of the hole type.

If the first type is p-type, the band offset between the valence band of the first dielectric material and the valence band of the first-type doped semiconductor material may be strictly greater than 3 kT/q. This makes it possible to prevent holes from being trapped in the first dielectric material and makes it possible for the surface conduction channel of the first dielectric material not to be supplied with charge carriers of the hole type.

In "3 kT/q", also notated as "3×k×T/q", k is the Boltzmann constant, T is the ambient temperature in kelvin, and q is a constant corresponding to the elementary charge in coulombs. The ambient temperature T may be between 300 K and 500 K.

An "offset" in the sense of the present description is a difference. The band offset is notably, depending on the case, an energy difference between the conduction bands of two materials or an energy difference between the valence bands of two materials.

A particular example of a diode 100 forming a gallium nitride (GaN)-based light-emitting diode is described herein. According to this particular example, the stack 101 of semiconductor layers may comprise, in succession, preferably starting from the substrate 112 (for example, the substrate 112 is a sapphire or silicon substrate) on which the stack 101 is arranged:
a layer of n-type doped gallium nitride forming the layer 110 of second-type doped semiconductor material for electron transport,
one or more alternations of layers, thus forming the active area 102, each alternation of layers comprising a layer of indium gallium nitride (InGaN) and a layer of gallium nitride (GaN), not intentionally doped, with a proportion of indium to be modulated as a function of the desired emission wavelength of the light-emitting diode,
a layer of p-type doped gallium nitride forming the layer 109 of first-type doped semiconductor material. By contrast with the substrate 112, the top of the stack 101 is preferably in contact with an anode 113. The layer of n-type doped gallium nitride is preferably in contact with an electrode formed, in the context of the particular example, by a cathode 117.

According to this particular example:
the first part 103a is then formed by p-type doped gallium nitride (the p-type dopant may be magnesium) and the first dielectric material forming the first passivation layer 107 may be an aluminum oxide such as $Al_2O_3$ or a silicon oxide such as $SiO_2$,
the second part 103b is then formed by the alternation(s) of layers of the active area 102, and the second dielectric material forming the second passivation layer 108 may be an aluminum oxide such as $Al_2O_3$,
the third part 103c is then formed by n-type doped gallium nitride (the n-type dopant may be silicon) and the third dielectric material forming the third passivation layer 111 may be an aluminum oxide such as $Al_2O_3$ or a silicon oxide such as $SiO_2$.

According to this particular example, the diode 100 may also comprise:
between the layer 110 of second-type doped semiconductor material and the active area 102, one or more layers of undoped gallium nitride (not shown) for preventing the diffusion of the n-type dopant in the active area 102, this or these layer(s) of undoped gallium nitride then being barrier layers to the diffusion of dopant,
between the active area 102 and the layer 109 of first-type doped semiconductor material, one or more layers of undoped gallium nitride (not shown) for preventing the diffusion of the p-type dopant in the active area 102, this or these layer(s) of undoped gallium nitride then being barrier layers to the diffusion of dopant, if necessary, between the active area 102 and the layer 109 of first-type doped semiconductor material, a layer of aluminum gallium nitride for forming an electron blocking layer, the proportion of aluminum in this electron blocking layer being adapted as a function of the desired blocking height; this layer of aluminum gallium nitride may be in contact with the active area 102 if the active area 102 is an alternation of undoped InGaN/GaN layers, or may be at a distance from the active area 102 if the active area 102 is formed solely by a layer of InGaN, for forming a p-i-n junction for example.

According to this particular example, it is the holes that are least present in the active area 102. This is because, by comparison with electrons, holes are less mobile, and the ionization energy of the p-type dopant is greater (the hole density in the active area 102 is therefore lower, and the height of the injection barrier is greater).

For this particular example, the differences in function and nature (i.e. the differences in composition) of the layers of the stack 101 underline the fact that a single passivation method that is perfectly applicable to all the layers forming the stack 101 of the light-emitting diode 100 is very difficult to define. When the passivation structure 106 with at least two passivation layers is present, this allows the best adaptation to the nature and function of the layers of the stack 101 of the light-emitting diode 100.

Figure 11:
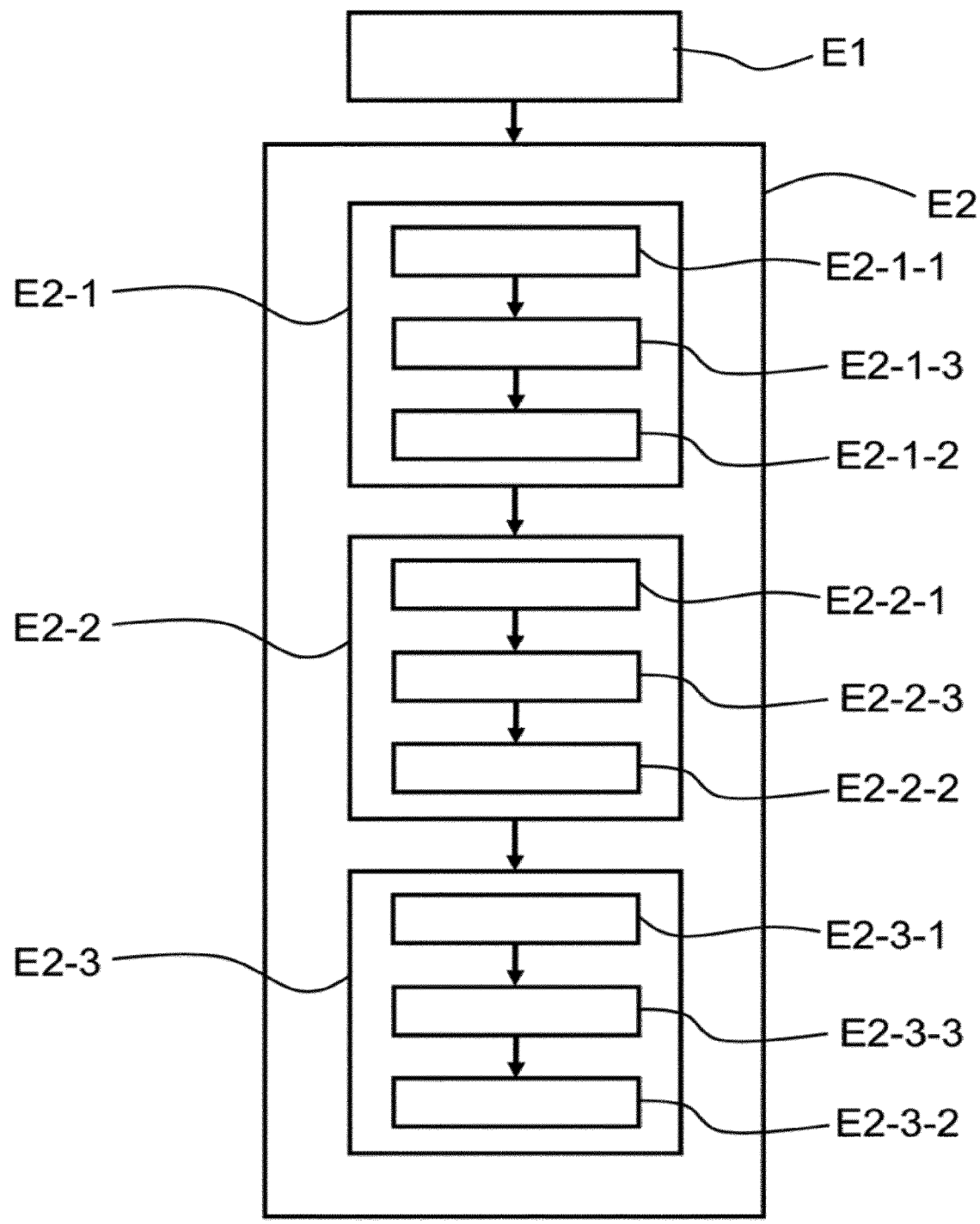
FIG. 11 shows a sequence of steps of the manufacturing method according to a particular embodiment of the invention.

The invention also relates to a method of manufacturing the diode 100, an embodiment of which is shown in FIGS. 1 and 3 to 10. Accordingly, everything that applies to the diode 100 described above may apply to the method of manufacturing the diode 100, and everything that applies to the method of manufacturing the diode 100 may apply to the diode 100 described above that may be produced by this manufacturing method. An example of the sequence of steps in this manufacturing method is also shown schematically in FIG. 11.

Figure 3:
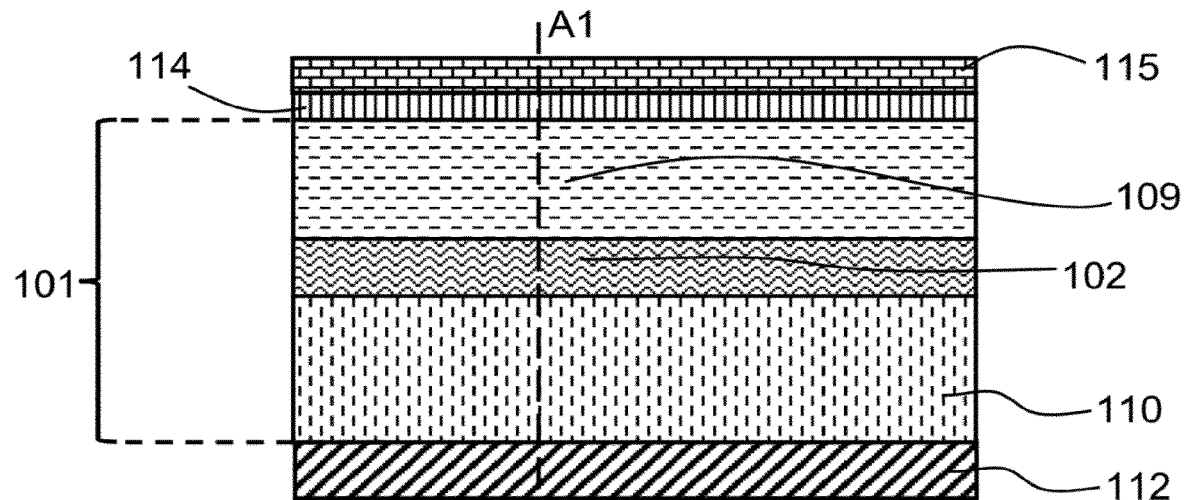
FIG. 3 is a view in cross section, showing the formation of a stack for the purpose of manufacturing the diode of FIG. 1.

The manufacturing method comprises a step E1 of forming the stack 101 of semiconductor layers, part of said stack 101 being intended to form the active area 102 of the diode 100 (FIG. 3). In fact, in the course of the manufacturing method, the stack 101 formed is modified in such a way that the diode 100 comprising the stack 101 as modified is finally obtained. The stack 101 is shown between two broken lines.

The manufacturing method comprises a step E2 of forming and passivating the lateral surface 103 of the stack 101 of semiconductor layers, a particular example of embodiment of which is shown in FIGS. 4 to 9.

To facilitate the production of the diode 100, before the lateral surface 103 is formed and passivated (step E2), a layer 114 of a material for forming an electrode (the anode 113, for example) of the diode 100 may be formed at the top of the stack 101, for example at the opposite end to the substrate 112 on which the base of the stack 101 rests, and a hard mask 115 may then be formed on this layer 114 of material for forming the electrode. A step of lithography may then delimit, within the hard mask 115, a mask called the "etching mask 116", which may be used for carrying out etching, for example anisotropic etching, of the stack 101 in a direction parallel to the stack axis A1 (FIGS. 4 to 8).

This step E2 of forming and passivating the lateral surface 103 comprises the formation E2-1 of the first passivation layer 107 and the formation E2-2 of the second passivation layer 108 (FIGS. 4 to 7), the first and second passivation layers 107, 108 being in contact with the lateral surface 103 and the second passivation layer 108 being formed partially on the first passivation layer 107. The second passivation layer 108 is then formed after the first passivation layer 107. Thus, step E2 enables the passivation structure 106, comprising these first and second passivation layers 107, 108, to be formed. As mentioned above, the forming of two passivation layers for passivating the lateral surface 103 enables the passivation to be improved locally, with allowance preferably being made, during the passivation of the lateral surface 103, for the presence of different materials forming this lateral surface 103.

Figure 6:
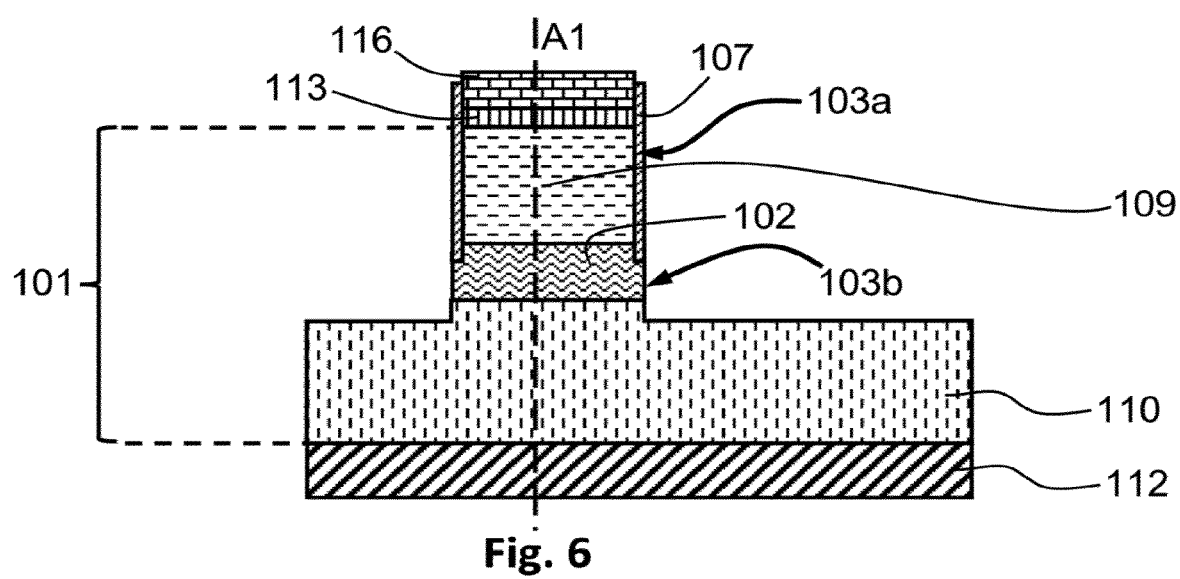
FIG. 6 shows, in a view in cross section, the section through FIG. 5 at the end of another step of etching the stack.
Figure 7:
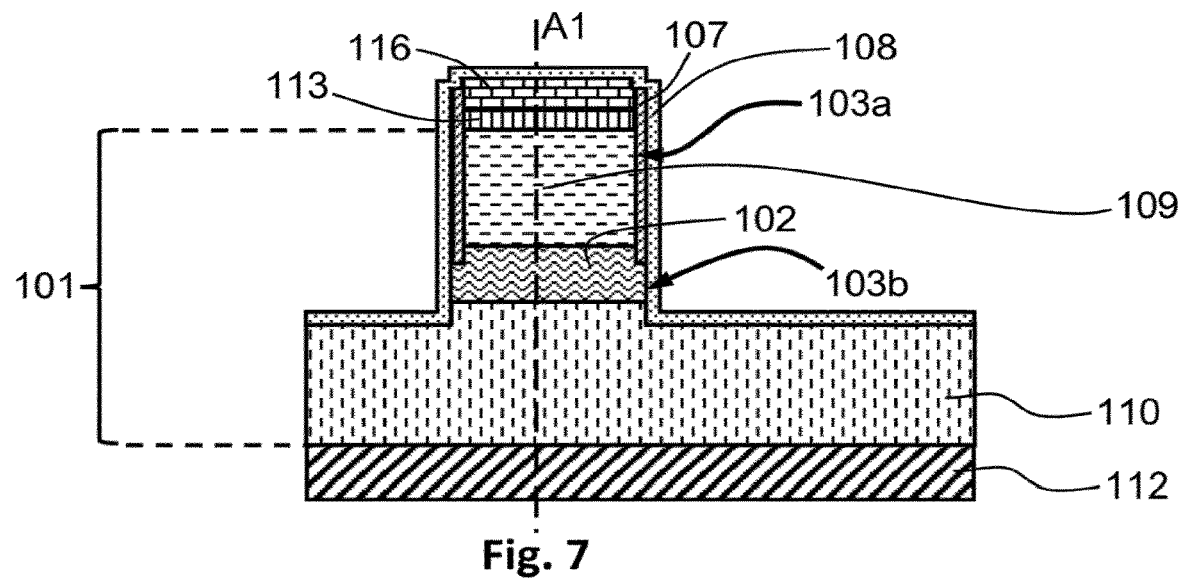
FIG. 7 shows, in a view in cross section, the section through FIG. 6 at the end of a step of depositing a second dielectric material.

Because of the need to form the aforementioned first and second passivation layers 107, 108 to contribute to the passivation of the lateral surface 103, it is necessary to find a technical solution for forming these layers at the edge of the stack 101 of the diode 100. For this purpose, step E2 of forming and passivating the lateral surface 103 may comprise, in succession:

a first etching step E2-1-1 (FIGS. 4 and 11) in which etching, preferably anisotropic, is carried out on the stack 101 so as to form the first part 103a of the lateral surface 103; the first etching step E2-1-1 may partially delimit the periphery of the active area 102 and may, if necessary, delimit the electrode such as the aforementioned anode 113, a step E2-1-2 of depositing (FIG. 5) the first dielectric material so as to form the first passivation layer 107, the first passivation layer 107 covering, and therefore being in contact with, the first part 103a of the lateral surface 103, a second etching step E2-2-1 (FIG. 6) in which etching, preferably anisotropic, is carried out on the first dielectric material deposited and on the stack 101 so as to form the second part 103b of the lateral surface 103, and preferably so as to delimit part of, and notably the rest of, the periphery of the active area 102 at the lateral surface 103, a step E2-2-2 of depositing the second dielectric material so as to form the second passivation layer 108, the second passivation layer 108 covering, and therefore being in contact with, the second part 103b of the lateral surface 103, and the second passivation layer 108 being in contact with the first passivation layer 107 (FIG. 7).

The first and second parts 103a, 103b of the lateral surface 103 may be formed by different materials. For example, if the active area 102 is formed from one or more layers, of intrinsic semiconductors for example, the materials of the first and second parts 103a, 103b are different. For example, if the active area 102 is formed at a junction between the layer 109 of first-type doped semiconductor material and the layer 110 of second-type doped semiconductor material, the second part 103b may be formed by a portion of the layer 109 of first-type doped semiconductor material and/or by a portion of the layer 110 of second-type doped semiconductor material: this enables the parts of the lateral surface 103 to be passivated according to their function. This sequence of steps makes it easy to form a lateral surface 103 in contact with two passivation layers, using simple microelectronic techniques, carrying out the etching, for example, with the aid of the etching mask 116 and the deposition of the first and second dielectric materials by conformable deposition. This makes it possible, above all, to provide different surface treatments of the first part 103a and the second part 103b, regardless of whether this first part 103a and this second part 103b are made of materials that are identical or different, or partially different.

Forming the first and second passivation layer 107, 108 in such a way as that described above has the further advantage that the first part 103a is formed and then passivated by means of the first passivation layer 107, before the second part 103b is formed and then passivated by means of the second passivation layer 108. Thus, in the manufacturing method, this allows the treatment, also called the surface treatment, to be performed in an independent and specific way on the first and second part 103a, 103b of the lateral surface 103, for the purpose of improving their passivation and thus, ultimately, the overall passivation of the stack 101 of the diode 100. These treatments make it possible to eliminate totally or partially, within the diode 100, the aforementioned defects that may interact with charge carriers by the trapping mechanism and/or the diffusion mechanism. Preferably, therefore, the manufacturing method comprises a first step E2-1-3 of treatment applied to the first part 103a of the lateral surface 103 before the execution of step E2-1-2 of depositing the first dielectric material, and a second step E2-2-3 of treatment applied to the second part 103b of the lateral surface 103 before the execution of step E2-2-2 of depositing the second dielectric material. The first treatment step E2-1-3 and the second treatment step E2-2-3 are different, in order to treat in different ways the first and second parts 103a, 103b of the lateral surface 103, which may for example be formed by different materials. Thus, it is possible, for example, to treat the first and second parts 103a, 103b in different ways by taking into account the semiconductor material forming the first part 103a and the semiconductor material forming the second part 103b. In particular, the second treatment step E2-2-3 has the advantage of being executed when the first part 103a is covered by the first passivation layer 107.

Thus, before the formation of the first passivation layer 107, step E2 of forming and passivating the lateral surface 103 may comprise the first treatment step E2-1-3, for preparing the first part 103a of the lateral surface 103 to receive the first passivation layer 107. Before the formation of the second passivation layer 108, step E2 of forming and passivating the lateral surface 103 may comprise the second treatment step E2-2-3, for preparing the second part 103b of the lateral surface 103 to receive the second passivation layer 108, this second treatment step E2-2-3 being executed after the formation of the first passivation layer 107, the first treatment step E2-1-3 being different from the second treatment step E2-2-3.

Figure 8:
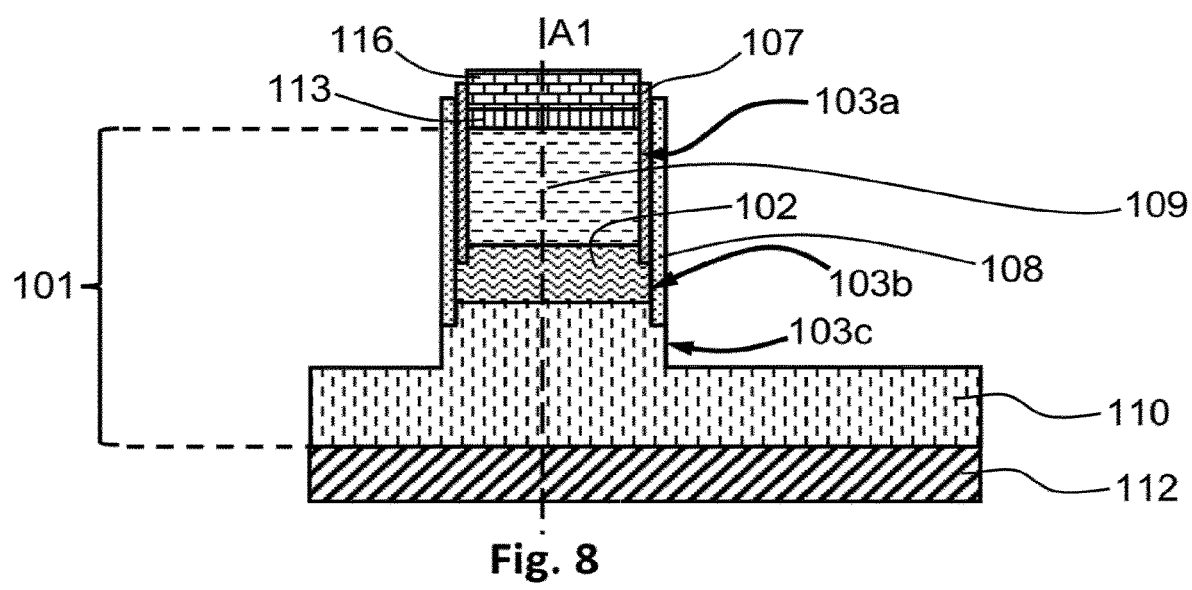
FIG. 8 shows, in a view in cross section, the section through FIG. 7 at the end of another step of etching the stack.
Figure 9:
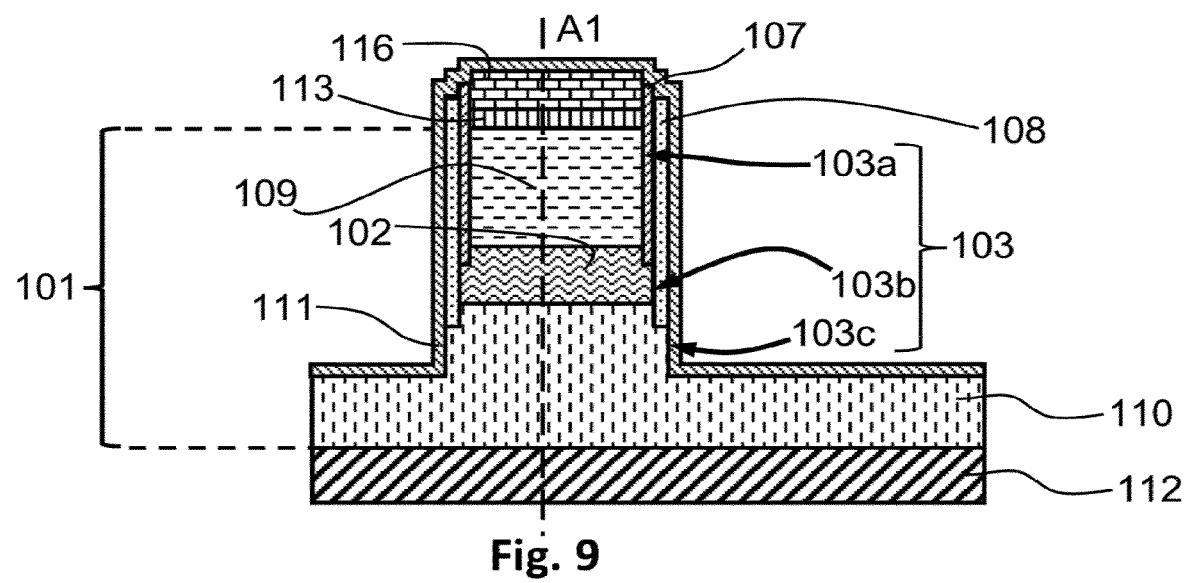
FIG. 9 shows, in a view in cross section, the section through FIG. 8 at the end of a step of depositing a third dielectric material.
Figure 10:
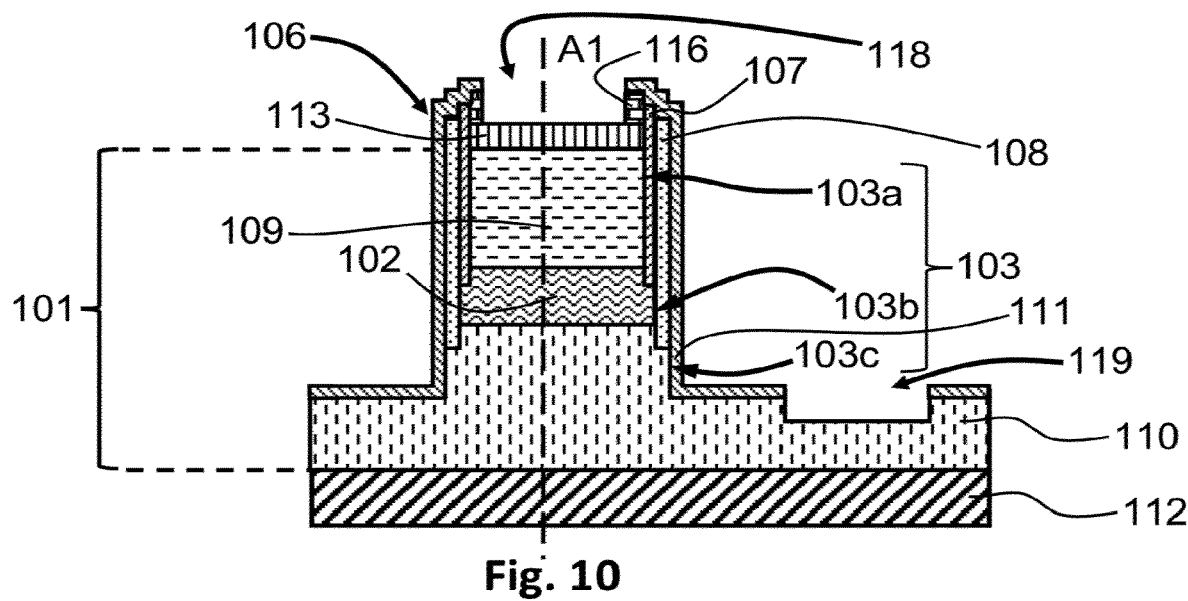
FIG. 10 shows, in a view in cross section, a step of etching, applied to the section through FIG. 9, for forming openings, notably in the third dielectric material.

Preferably, for the purpose of forming, in E2-3, the aforementioned third passivation layer 111 (FIGS. 9 and 11) belonging to the passivation structure 106, step E2 of forming and passivating the lateral surface 103 comprises a third etching step E2-3-1, in which the second dielectric material deposited and the stack 101 are etched so that the third part 103c of the lateral surface 103 is formed (movement from FIG. 7 to FIG. 8). Step E2 of forming and passivating the lateral surface 103 also comprises a step E2-3-2 of depositing the third dielectric material so as to form the third passivation layer 111 (FIG. 9), the third passivation layer 111 covering, and therefore being in contact with, the third part 103c of the lateral surface 103. The third passivation layer 111 is also in contact with the second passivation layer 108. The third part 103c may be formed by a different material from the material forming the second part 103b. In the case of the junction between the layer 109 of first-type doped semiconductor material and the layer 110 of second-type doped semiconductor material, the third part 103c may be made of the same material as the second part 103b or of the same material as a portion of the second part 103b, thus enabling the parts of the lateral surface 103 to be passivated according to their function. The third part 103c is notably formed by a different material from the material forming the first part 103a. These steps have the advantage of allowing the third part 103c of the lateral surface 103 to be passivated in a suitable way. This also has the advantage, if required, that a specific treatment of the second part 103b is executed (by the second treatment step E2-2-3) without this specific treatment having any effect on the third part 103c, which is then formed after this specific treatment.

Additionally, the forming of the third part 103c of the lateral surface 103 as described may allow the execution of a third step E2-3-3 of treatment applied to the third part 103c of the lateral surface 103 before the execution of step E2-3-2 of depositing the third dielectric material. This third treatment step E2-3-3 has the advantage of being executed when the second part 103b is covered by the second passivation layer 108.

For example, each treatment step described in the present description enables an area associated with it to be treated, this area being: the first part 103a for the first treatment step E2-1-3, the second part 103b for the second treatment step E2-2-3, or possibly, if appropriate, the third part 103c for the third treatment step E2-3-3. The step of treating an area enables the passivation of this area to be improved when the corresponding dielectric material (the first, second or third dielectric material as the case may be) is deposited on this area to form the passivation layer that passivates this area. Therefore, each treatment step may comprise one or more of the following steps: a cleaning step, for removing hydrocarbons and/or carbon and/or oxygen adsorbed on the associated treatment area; a step of surface etching, of a native oxide of the material of the associated treatment area, for example, this native oxide being formed on the surface of the associated treatment area (for example, this surface etching step is NH$_4$OH etching if the native oxide is that of indium nitride); a step of selective etching of an amorphous semiconductor that has been formed on the associated treatment area (for example, by a step of TMAH etching, where TMAH stands for tetramethylammonium hydroxide, if the amorphous semiconductor is amorphous gallium nitride); a step of slow etching, that is to say sufficiently reproducible etching to avoid etching the whole of the diode, of the material forming the associated treatment area (for example, this etching step is KOH etching, where KOH stands for potassium hydroxide, if the material is GaN; the KOH makes it possible to reveal some crystal planes and obtain a very smooth surface when the associated treatment area comprises GaN, thus producing a treated area with far fewer structural defects); and a step of grafting elements onto the associated treatment area to prevent re-adsorption on this area and/or oxidation of this area. An advantage of grafting elements is that these elements temporarily bring the area into equilibrium before the corresponding dielectric material is deposited on this area, the deposition of the dielectric material also eliminating the grafted elements.

More generally, each treatment step may be used to treat the area associated with it while preventing the appearance of unsatisfied molecular bonds on said area during the deposition of corresponding dielectric material on this area.

Surface etching is considered to be what is known as "finishing" etching, for obtaining a surface with a composition and crystal structure of the etched material that is as close as possible to that of a corresponding solid semiconductor material.

Thus, as a general rule, the first treatment step E2-1-3 may comprise a step of cleaning the first part 103a and/or a step of surface etching the first part 103a and/or a step of grafting elements onto the first part 103a. The second treatment step E2-2-3 may comprise a step of cleaning the second part 103*b* and/or a step of surface etching the second part 103*b* and/or a step of grafting elements onto the second part 103*b*. If required, the third treatment step E2-3-3 may comprise a step of cleaning the third part 103*c* and/or a step of surface etching the third part 103*c* and/or a step of grafting elements onto the third part 103*c*. In the context of this paragraph, each etching step makes it possible to eliminate materials that are adsorbed and/or amorphized in the corresponding treated part (the first, second or third part 103*a*, 103*b*, 103*c*) of the lateral surface, and to smooth and homogenize the electronic interface of the corresponding treated part of the lateral surface 103 before the deposition of corresponding dielectric material, in order to avoid creating defects that would introduce a trap level into the gap of the corresponding material. In the context of this paragraph, each step of grafting elements, these elements being atoms for example, enables dangling bonds to be temporarily blocked with atoms that are thermodynamically stable. These grafted elements may introduce bonds onto the corresponding part of the lateral surface 103, but these bonds will be broken during the deposition of corresponding dielectric material on this corresponding part of the lateral surface 103. For example, sulfur may prevent the oxidation of a semiconductor material by replacing oxygen. These atoms may be sulfur atoms, which are particularly useful for preventing the oxidation of GaN, InGN, AlGaN, GaP, InGaP and AlInGaP. The bonds of the grafted elements/atoms are broken during the deposition of the dielectric material on the corresponding part of the lateral surface, in which case the deposition may be at high temperature (typically strictly above 100° C.), using a plasma if required. In fact, in the context of grafted atoms, the graft must have a stable thermodynamic bond at ambient temperature (the ambient temperature being, in particular, equal to 300 kelvin in this case) to protect the surface on which it is grafted, and this bond must break at the deposition temperature of the corresponding dielectric material, which may be strictly above 100° C. and strictly below 400° C. The cleaning steps mentioned in the present paragraph may be such as described above; that is to say, they, and notably each of them, may make it possible to ensure the removal of the hydrocarbons and/or the carbon and/or the oxygen that have been adsorbed on the corresponding first part 103*a*, second part 103*b*, or third part 103*c*, as the case may be, of the lateral surface 103.

Preferably, the step E1 of forming the stack 101 of semiconductor layers is such that the stack 101 comprises the layer 109 of first-type doped semiconductor material and the layer 110 of second-type doped semiconductor material. In this case:
- the first part 103*a* of the lateral surface 103 is delimited by a portion of said layer 109 of first-type doped semiconductor material,
- the second part 103*b* of the lateral surface 103 is delimited by a portion of the active area 102,
- if required, the third part 103*c* of the lateral surface 103 may be delimited by a portion of the layer 110 of second-type doped semiconductor material.

In this case, the active area 102 may be arranged between the layer 109 of first-type doped semiconductor material and the layer 110 of second-type doped semiconductor material. Alternatively, the active area 102 may be arranged at a junction between the layer 109 of first-type doped semiconductor material and the layer 110 of second-type doped semiconductor material. This structure is particularly suitable for the formation of the diode 100.

For each of the first and second dielectric materials, and for the third dielectric material if appropriate, the thickness of the corresponding dielectric material and the conditions of its etching will be selected so that the layer of said deposited dielectric material is not completely etched in any etching step that may follow the deposition of this layer of said dielectric material, so that the desired function of the corresponding passivation layer is provided in the diode 100. To summarize, either the thickness of deposited dielectric material is increased, that is to say the selected etching exhibits high etching selectivity between the semiconductor of the stack 101 to be etched and the dielectric material, or the etching is made more directional by increasing the polarization voltage or the bias, or by a combination of any or all of these alternatives.

The characteristics of the first to the third dielectric material in the context of the description of the diode 100 may evidently be applicable to the manufacturing method.

The deposition of each of the first to the third dielectric materials is preferably carried out conformably to allow uniform and undamageable deposition on the surfaces where it is deposited (that is to say, this deposition tends not to degrade the initial chemical and electronic state of the surfaces on which it is carried out).

Typically, in the finished diode 100, each passivation layer (particularly each of the first, second and, if required, third passivation layers) has a thickness that is insignificant, and is at least one thickness of an atomic layer. Each passivation layer may have a thickness ranging from several atomic layers to several hundreds of nanometers. In fact, the thickness must be sufficient to protect the passivated surface during any subsequent etching, and during subsequent treatments, if any, that may consume part of the previously deposited passivation layer.

According to a particular embodiment of the manufacturing method for which the diode 100 to be manufactured is a gallium nitride-based light-emitting diode, notably according to the particular example described above, the manufacturing method is such as that described below by way of example.

When the stack 101 has been provided, for example by being formed on the substrate 112, and surmounted by a layer 114 of an anode material and then a hard mask 115 (FIG. 3), lithography is carried out to delimit the etching mask 116 in the hard mask.

Figure 4:
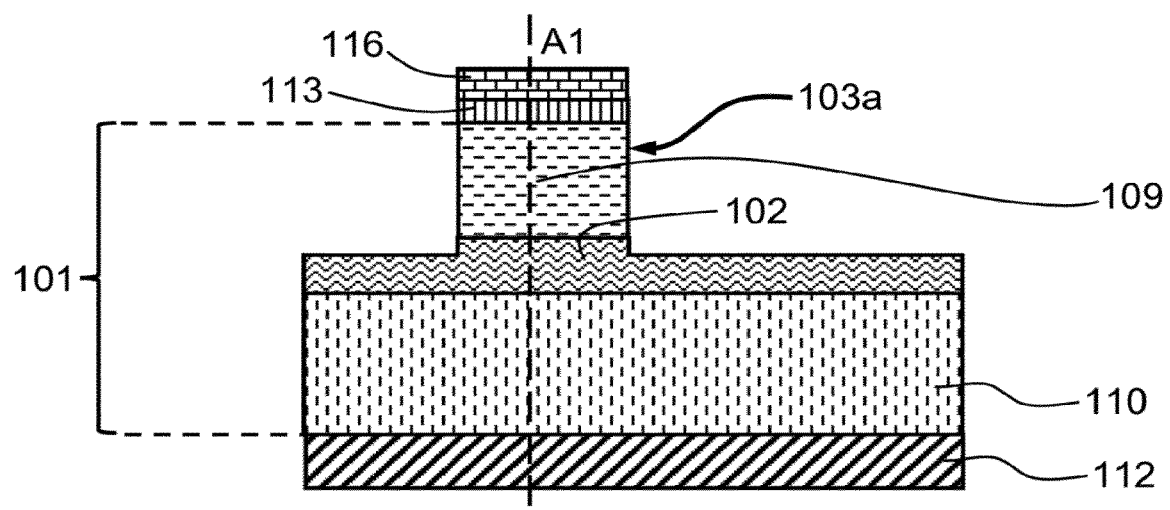
FIG. 4 shows, in a view in cross section, the section through FIG. 3 at the end of a step of etching the stack.
Figure 5:
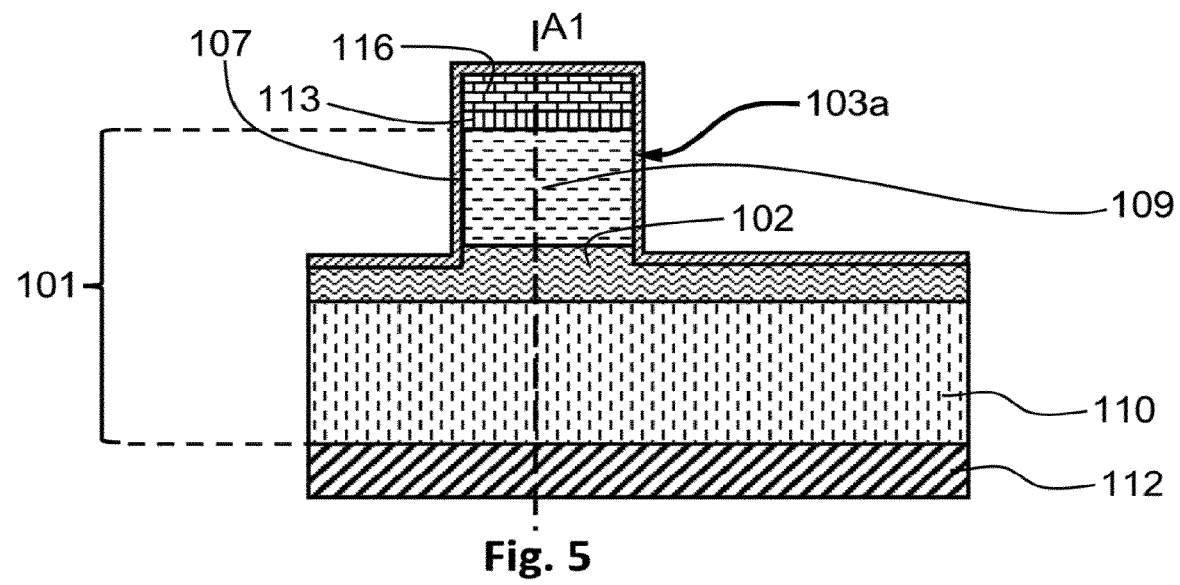
FIG. 5 shows, in a view in cross section, the section through FIG. 4 at the end of a step of depositing a first dielectric material.

The first etching step E2-1-1 may be chlorine/argon ICP (abbreviation for "Inductively Coupled Plasma") etching, for etching the hard mask 115 outside the etching mask 116, then the anode material for forming the anode 113, then the layer 109 of first-type doped semiconductor material to delimit the first part 103*a* of the lateral surface 103 then formed by p-type doped gallium nitride belonging to the layer 109 of first-type doped semiconductor material (FIG. 4). This first etching step E2-1-1 is stopped in the active area 102 (or, if appropriate, in the layer 110 of second-type doped semiconductor material if the aim is to manufacture the diode 100 of FIG. 2). This first etching step E2-1-1 is, notably, carried out anisotropically, according to the etching mask 116, in a direction parallel to the stack axis A1.

The first treatment step E2-1-3 may then be applied to the first part 103*a* (notably in FIG. 4). This first treatment step comprises a step of etching the first part 103*a* by NH₄OH etching or by KOH etching or by TMAH etching or by deoxidizing etching. The deoxidizing etching may be dilute HF (hydrofluoric acid) etching or buffered oxide etching, also known by the abbreviation BOE. This first treatment step E2-1-3 tends not to consume the etching mask 116 and the anode 113, in order to avoid a situation in which, after the step of depositing the first dielectric material, the first part 103a is no longer encapsulated by the first dielectric material.

The step E2-1-2 of depositing the first dielectric material (FIG. 5) may enable an aluminum oxide (such as $Al_2O_3$) or a silicon oxide (such as $SiO_2$) to be conformably deposited as the first dielectric material. This first dielectric material may be deposited by ALD (Atomic Layer Deposition) or PE-ALD (Plasma Enhanced Atomic Layer Deposition).

The second etching step E2-2-1 (FIG. 6) may be chlorine/argon ICP etching, for etching the first dielectric material and the layer 110 of second-type doped semiconductor material while contributing to the delimitation of the active area 102 by stopping the second etching step E2-2-1 after it has reached the layer 110 of second-type doped semiconductor material. The result of this second etching step E2-2-1 is that the second part 103b is formed by the material of the active area 102. This second etching step E2-2-1 tends not to consume the first dielectric material deposited on the first part 103a.

The second treatment step E2-2-3 may then be applied to the second part 103b (notably in FIG. 6). This second treatment step E2-2-3 comprises a step of etching the second part 103b by etching using $NH_4OH$ and/or $(NH_4)_2S$. Preferably, this second treatment step E2-2-3 tends not to consume the first dielectric material deposited on the first part 103a or, preferably, the etching mask 116.

The step E2-2-2 of depositing the second dielectric material (FIG. 7) may enable an aluminum oxide (such as $Al_2O_3$) to be conformably deposited as the second dielectric material. This second dielectric material may be deposited by ALD or PE-ALD.

The third etching step E2-3-1 (FIG. 8) may be chlorine/argon ICP etching, for etching the second dielectric material and the layer 110 of second-type doped semiconductor material in order to delimit the third part 103c of the lateral surface 103. The result of this third etching step E2-3-1 is that the third part 103c is formed by n-type doped gallium nitride belonging to the layer 110 of second-type doped semiconductor material. In particular, the second part 103c is separated from the second part 103b by part of the layer 110 of second-type doped semiconductor material.

The third treatment step E2-3-3 may then be applied to the third part 103c (notably in FIG. 8). This third treatment step E2-3-3 comprises a step of etching the third part 103c by $NH_4OH$ etching or by KOH etching or by TMAH etching. This third treatment step E2-3-3 tends not to consume the etching mask 116 and the second dielectric material deposited on the second part 103b of the lateral surface 103.

The step E2-3-2 of depositing the third dielectric material (FIG. 9) may enable an aluminum oxide (such as $Al_2O_3$) or a silicon oxide (such as $SiO_2$) to be conformably deposited as the third dielectric material. This third dielectric material may be deposited by ALD or PE-ALD.

Then, after the step E2-3-2 of depositing the third material, the third passivation layer 111 may be opened in two regions 118, 119 (FIG. 10), for the purpose, on the one hand, of enabling at least a part of the etching mask 116 to be removed in order to make the anode 113 accessible, and, on the other hand, for the purpose of enabling the cathode 117 (FIG. 1) to be formed in contact with the layer 110 of second-type doped semiconductor material.

The present invention is preferably applicable to what are known as small light-emitting diodes, that is to say light-emitting diodes having at least one of its dimensions in the stack plane of the semiconductor layers smaller than or equal to 100 times the greatest of the diffusion lengths of an electron or a hole or an exciton in one of the semiconductors forming the stack 101.

The present invention is also applicable to arrays of light-emitting diodes, that is to say to the juxtaposition of light-emitting diodes to form an assembly of light-emitting diodes that are close together in spatial terms, or to collective formation of light-emitting diodes sharing the same supporting plate.

Although the examples of embodiment primarily relate to a gallium nitride-based light-emitting diode, the present invention is transferable to any other inorganic semiconductor and to all light-emitting diode architectures.

In particular, depending on the first type of doping and the second type of doping, respectively, for the layer 109 of first-type doped semiconductor material and for the layer 110 of second-type doped semiconductor material, the aforementioned electrodes (anode and cathode) may be reversed. Thus, in general terms, the diode 100 may comprise electrodes configured for interacting with the stack 101.

The present invention describes an industrial application in the field of the manufacture and use of diodes.

The invention claimed is:

1. A diode comprising:
   a stack of semiconductor layers, the stack comprising a lateral surface,
   an active area arranged within the stack,
   a first passivation layer and a second passivation layer,
   the first passivation layer being in contact with the lateral surface, the second passivation layer being in contact with the lateral surface, the second passivation layer being formed partially on the first passivation layer, the stack comprising a layer of first-type doped semiconductor material and a layer of second-type doped semiconductor material, wherein:
   the first passivation layer is in contact, at the lateral surface, with the layer of first-type doped semiconductor material and the active area,
   the second passivation layer is in contact, at the lateral surface, with the active area, and
   the active area is arranged between the layer of first-type doped semiconductor material and the layer of second-type doped semiconductor material, or the active area is arranged at a junction between the layer of first-type doped semiconductor material and the layer of second-type doped semiconductor material.

2. The diode as claimed in claim 1, comprising a third passivation layer, the third passivation layer being in contact, at the lateral surface, with the layer of second-type doped semiconductor material.

3. The diode as claimed in claim 1, wherein the first passivation layer is formed from a first dielectric material and the second passivation layer is formed from a second dielectric material.

4. The diode as claimed in claim 2, wherein the third passivation layer is formed from a third dielectric material.

5. The diode as claimed in claim 3, wherein:
   the first dielectric material has an electrical conductivity at least three orders of magnitude lower than an electrical conductivity of the first-type doped semiconductor material, and
   the second dielectric material has an electrical conductivity at least three orders of magnitude lower than an electrical conductivity of a semiconductor material forming the active area.

6. The diode as claimed in claim 3, wherein
the active area comprises an intrinsic semiconductor material,
a band offset between a valence band of the intrinsic semiconductor material and a valence band of the second dielectric material is strictly greater than 3 kT/q, and
a band offset between a conduction band of the intrinsic semiconductor material and a conduction band of the second dielectric material is strictly greater than 3 kT/q, where k is the Boltzmann constant, T is an ambient temperature in kelvin, and q is a constant corresponding to the elementary charge in coulombs.

7. The diode as claimed in claim 4, wherein the third dielectric material has an electrical conductivity at least three orders of magnitude lower than an electrical conductivity of the second-type doped semiconductor material.

8. The diode as claimed in claim 4, wherein:
the first passivation layer is formed from a first dielectric material,
the first type being n-type, a band offset between a conduction band of the first dielectric material and a conduction band of the first-type doped semiconductor material is strictly greater than 3 kT/q, and
the second type being p-type, a band offset between a valence band of the third dielectric material and a valence band of the second-type doped semiconductor material is strictly greater than 3 kT/q,
or
the second type being n-type, a band offset between a conduction band of a third dielectric material and a conduction band of the second-type doped semiconductor material is strictly greater than 3 kT/q, and
the first type being p-type, the band offset between a valence band of the first dielectric material and a valence band of the first-type doped semiconductor material is strictly greater than 3 kT/q,
where k is the Boltzmann constant, T is an ambient temperature in kelvin, and q is a constant corresponding to the elementary charge in coulombs.

9. A method of manufacturing a diode, the manufacturing method comprising:
forming a stack of semiconductor layers, part of said stack being configured to form an active area of the diode,
forming and passivating a lateral surface of the stack of semiconductor layers, said forming and passivating the lateral surface comprising forming a first passivation layer and forming a second passivation layer, the first and second passivation layers being in contact with the lateral surface, and the second passivation layer being formed partially on the first passivation layer,
forming and passivating the lateral surface comprising, in succession:
etching of the stack so as to form a first part of the lateral surface,
depositing a first dielectric material so as to form the first passivation layer, the first passivation layer covering the first part of the lateral surface,
etching the first dielectric material deposited and the stack so as to form a second part of the lateral surface, and
depositing a second dielectric material so as to form the second passivation layer, the second passivation layer covering the second part of the lateral surface and being in contact with the first passivation layer, wherein
forming the stack of semiconductor layers comprises forming the stack to include:
a layer of first-type doped semiconductor material, and
a layer of second-type doped semiconductor material,
the first part of the lateral surface is delimited by a portion of said layer of first-type doped semiconductor material and a first portion of the active area,
the second part of the lateral surface is delimited by a second portion of the active area, and
the active area is arranged between the layer of first-type doped semiconductor material and the layer of second-type doped semiconductor material, or the active area is arranged at a junction between the layer of first-type doped semiconductor material and the layer of second-type doped semiconductor material.

10. The manufacturing method as claimed in claim 9, comprising:
applying a first treatment to the first part of the lateral surface before the depositing the first dielectric material, and
applying a second treatment to the second part of the lateral surface before of depositing the second dielectric material,
the first treatment and the second treatment being different.

11. The manufacturing method as claimed in claim 10, wherein:
applying the first treatment comprises at least one of cleaning the first part, surface etching the first part, and grafting elements onto the first part, and
applying the second treatment comprises at least one of cleaning the second part, surface etching the second part, and grafting elements onto the second part.

12. The manufacturing method as claimed in claim 9, wherein forming and passivating the lateral surface comprises:
etching of the second dielectric material deposited and of the stack so as to form a third part of the lateral surface, and
depositing a third dielectric material so as to form a third passivation layer, the third passivation layer covering the third part of the lateral surface and being in contact with the second passivation layer.

13. The manufacturing method as claimed in claim 12, applying a third treatment to the third part of the lateral surface before depositing the third dielectric material.

14. The manufacturing method as claimed in claim 13, wherein applying the third treatment comprises at least one of cleaning the third part, surface etching the third part, and grafting elements onto the third part.

15. The manufacturing method as claimed in claim 12, wherein the third part of the lateral surface is delimited by a portion of the layer of second-type doped semiconductor material.

16. A diode comprising:
a stack of semiconductor layers, the stack comprising a lateral surface,
an active area arranged within the stack,
a first passivation layer and a second passivation layer,
the first passivation layer being in contact with the lateral surface, the second passivation layer being in contact with the lateral surface, the second passivation layer being formed partially on the first passivation layer, the stack comprising a layer of first-type doped semiconductor material and a layer of second-type doped semiconductor material, wherein:
the first passivation layer is in contact, at the lateral surface, with the layer of first-type doped semiconductor material, the second passivation layer is in contact, at the lateral surface, with the active area, the active area is arranged between the layer of first-type doped semiconductor material and the layer of second-type doped semiconductor material, or the active area is arranged at a junction between the layer of first-type doped semiconductor material and the layer of second-type doped semiconductor material, a portion of the first passivation layer is directly formed on and directly adjacent to a portion of the lateral surface corresponding to the active area, and a portion of the second passivation layer is directly formed on and directly adjacent to the portion of the first passivation layer.

* * * * *